US012610472B2

(12) United States Patent
Mutnury et al.

(10) Patent No.: US 12,610,472 B2
(45) Date of Patent: Apr. 21, 2026

(54) INTEGRATED CIRCUIT (IC) ASSEMBLY INCLUDING A DIRECT CONNECTION PAD STRUCTURE FOR A SURFACE-MOUNT DEVICE (SMD)

(71) Applicant: Dell Products L.P., Round Rock, TX (US)

(72) Inventors: Bhyrav M. Mutnury, Round Rock, TX (US); Sandor Tibor Farkas, Round Rock, TX (US); James Lewis Petivan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 177 days.

(21) Appl. No.: 18/426,969

(22) Filed: Jan. 30, 2024

(65) Prior Publication Data

US 2025/0247964 A1     Jul. 31, 2025

(51) Int. Cl.
| | |
|---|---|
| *H05K 3/34* | (2026.01) |
| *H01L 21/48* | (2006.01) |
| *H01L 23/31* | (2006.01) |
| *H01L 25/065* | (2023.01) |
| *H05K 1/02* | (2006.01) |

(Continued)

(52) U.S. Cl.
CPC ......... *H05K 3/3485* (2020.08); *H01L 21/486* (2013.01); *H01L 23/3128* (2013.01); *H01L 25/0657* (2013.01); *H05K 1/0298* (2013.01); *H05K 3/341* (2013.01); *H05K 3/3436* (2013.01); *H05K 3/3457* (2013.01); *H05K 3/363* (2013.01); *H05K 3/429* (2013.01); *H01L 2924/1517* (2013.01); *H01L 2924/15311* (2013.01);

(Continued)

(58) Field of Classification Search
CPC ...... H05K 3/3457; H05K 3/363; H05K 3/341; H05K 1/0298; H05K 3/3485; H05K 3/3436; H05K 3/429; H05K 2201/10734; H05K 2203/041; H05K 2225/06517; H01L 21/486; H01L 23/3128; H01L 2924/15311; H01L 2924/16225; H01L 2924/1517; H01L 25/0657
See application file for complete search history.

(56) References Cited

U.S. PATENT DOCUMENTS

| | | | | |
|---|---|---|---|---|
| 11,791,228 B2 * | 10/2023 | Marin | ................... | H01L 23/488 257/678 |
| 12,412,842 B2 * | 9/2025 | Karhade | ................. | H01L 24/14 |

(Continued)

*Primary Examiner* — Alonzo Chambliss
(74) *Attorney, Agent, or Firm* — McDermott Will & Schulte LLP

(57) ABSTRACT

An IC assembly, including a PCB, including a first stripline; a ground layer; a first cavity extending from the PCB to the first stripline; a second cavity extending from the PCB to the ground layer; wherein the first cavity includes first solder paste in contact with the first portion of the first stripline exposed at the first cavity, wherein the second cavity includes second solder paste in contact with the second portion of the ground layer exposed at the second cavity, a BGA including a first solder ball and a second solder ball; wherein the BGA is coupled to the PCB, including: the first solder ball positioned within the first cavity such that the first solder ball contacts the first solder paste in the first cavity; the second solder ball positioned with the second cavity such that the second solder ball contacts the second solder paste in the second cavity.

11 Claims, 8 Drawing Sheets

590

(51) Int. Cl.
| | | |
|---|---|---|
| *H05K 3/341* | (2026.01) | |
| *H05K 3/3485* | (2026.01) | |
| *H05K 3/36* | (2006.01) | |
| *H05K 3/42* | (2006.01) | |

(52) U.S. Cl.
CPC ............. *H05K 2201/10734* (2013.01); *H05K 2203/041* (2013.01)

(56) References Cited

U.S. PATENT DOCUMENTS

| | | | |
|---|---|---|---|
| 2005/0048756 A1* | 3/2005 | Matsunami ......... | G01R 1/0735 |
| | | | 257/E21.508 |
| 2022/0071022 A1* | 3/2022 | Kong ..................... | H01L 23/13 |

* cited by examiner

SYSTEM BUS
121

PROCESSOR
SUBSYSTEM
120

100

MEMORY
SUBSYSTEM
130

I/O
SUBSYSTEM
140

LOCAL
STORAGE
RESOURCE
150

NETWORK
INTERFACE
160

NETWORK
110

NETWORK
STORAGE
RESOURCE
170

INTEGRATED CIRCUIT (IC) ASSEMBLY INCLUDING A DIRECT CONNECTION PAD STRUCTURE FOR A SURFACE-MOUNT DEVICE (SMD)

BACKGROUND

Field of the Disclosure

The disclosure relates generally to an integrated circuit (IC) assembly including a direct connection pad structure for a surface-mount device (SMD).

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

The breakout patterns required by today's surface-mount devices (SMD) including ball grid array devices (such as central processing units) create large dense via fields containing many sensitive high-speed signals.

SUMMARY

Innovative aspects of the subject matter described in this specification may be embodied in an assembly including an integrated circuit (IC) assembly, including a printed circuit board (PCB), including a first stripline; a ground layer; a first cavity extending from a first surface of the PCB to the first stripline, the first cavity exposing a first portion of the first stripline; and a second cavity extending from the first surface of the PCB to the ground layer, the second cavity exposing a second portion of the ground layer; wherein the first cavity includes first solder paste in contact with the first portion of the first stripline exposed at the first cavity, wherein the second cavity includes second solder paste in contact with the second portion of the ground layer exposed at the second cavity, a ball grid array (BGA), including a first solder ball and a second solder ball; wherein the BGA is coupled to the PCB, including: the first solder ball positioned within the first cavity such that the first solder ball contacts the first solder paste in the first cavity; and the second solder ball positioned with the second cavity such that the second solder ball contacts the second solder paste in the second cavity.

Other embodiments of these aspects include corresponding systems and apparatus.

These and other embodiments may each optionally include one or more of the following features. For instance, the first cavity including first plated side walls. The first solder paste is coupled between the first solder ball and the first portion of the first stripline exposed at the first cavity. The first solder ball is in electrical communication with the first portion of the first stripline exposed at the first cavity via the first solder paste. The first cavity is formed at the first surface of the PCB, wherein the second cavity is formed at the first surface of the PCB. The second cavity including second plated side walls. The second solder paste is coupled between the second solder ball and the second portion of the ground layer exposed at the second cavity. The second solder ball is in electrical communication with the second portion of the ground layer exposed at the second cavity via the second solder paste. The PCB further includes: a second stripline; and a third cavity extending from the first surface of the PCB to the second stripline, the third cavity exposing the second stripline, the third cavity including a third solder paste in contact with the third portion of the second stripline exposed at the third cavity, wherein the BGA includes a third solder ball, wherein the BGA is coupled to the PCB, including: the third solder ball positioned within the third cavity such that the third solder ball contacts the third solder paste in the third cavity. The first stripline is the same as the second stripline. The first stripline is different from the second stripline.

Particular implementations of the subject matter described in this specification can be implemented so as to realize one or more of the following advantages. For example, improved signal integrity (SI) for high-speed traces routed on L2 or L3 with no via, no microstrip routing, and greater separation between neighboring traces/vias. For example, improved SI for high-speed traces routed on other layers with potential elimination of microstrip routing as dog-bone segment from via to ball can be done on L2 or L3, and reduced neckdown length for BGA via field as elimination of vias for things routed on L3 and L2 reduces the overall size of the via field. For example, improved thermal coupling of BGA devices to the board resulting from direct connection of ground balls to L2 without dog-bones. For example, improved reliability including better solder joints resulting from each ball sits inside a little cup with contact all around, improved shock and vibe performance as the balls are supported on all sides.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
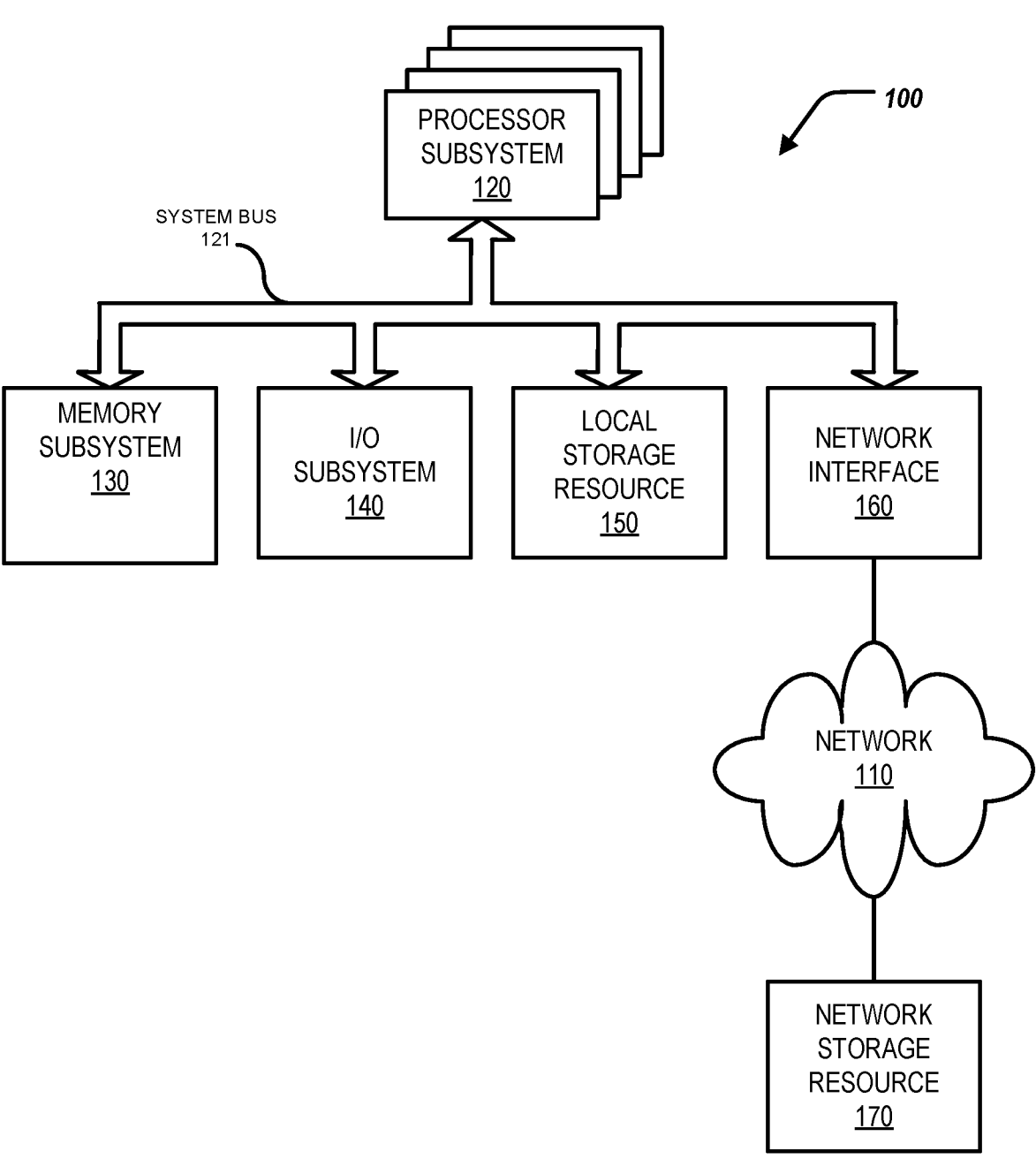
FIG. 1 is a block diagram of selected elements of an embodiment of an information handling system.

This disclosure discusses an integrated circuit (IC) assembly including a direct connection pad structure for surface-mount device (SMD) such as a ball grid array (BGA). In short, a SMD can directly connect to a printed circuit board (PCB) by sinking the SMD into the PCB and directly accessing striplines of the PCB. The SMD can access the striplines without a via, a via stub, or microstrip routing.

Specifically, this disclosure discusses an integrated circuit (IC) assembly, including a printed circuit board (PCB), including a first stripline; a ground layer; a first cavity extending from a first surface of the PCB to the first stripline, the first cavity exposing a first portion of the first stripline; and a second cavity extending from the first surface of the PCB to the ground layer, the second cavity exposing a second portion of the ground layer; wherein the first cavity includes first solder paste in contact with the first portion of the first stripline exposed at the first cavity, wherein the second cavity includes second solder paste in contact with the second portion of the ground layer exposed at the second cavity, a ball grid array (BGA), including a first solder ball and a second solder ball; wherein the BGA is coupled to the PCB, including the first solder ball positioned within the first cavity such that the first solder ball contacts the first solder paste in the first cavity; and the second solder ball positioned with the second cavity such that the second solder ball contacts the second solder paste in the second cavity.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such as wires, optical fibers, microwaves, radio waves, and other electromagnetic and/or optical carriers; and/or any combination of the foregoing.

Particular embodiments are best understood by reference to FIGS. 1-6 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include one or more processing resources such as a central processing unit (CPU), microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, a camera, or another type of peripheral device.

Local storage resource 150 may comprise computer-readable media (e.g., hard disk drive, floppy disk drive, CD-ROM, and/or other types of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other types of rotating storage media, flash memory, EEPROM, and/or other types of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g., corporate) network. The network may be implemented as, or may be a part of, a storage area network (SAN), a personal area network (PAN), a local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g., customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet, or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
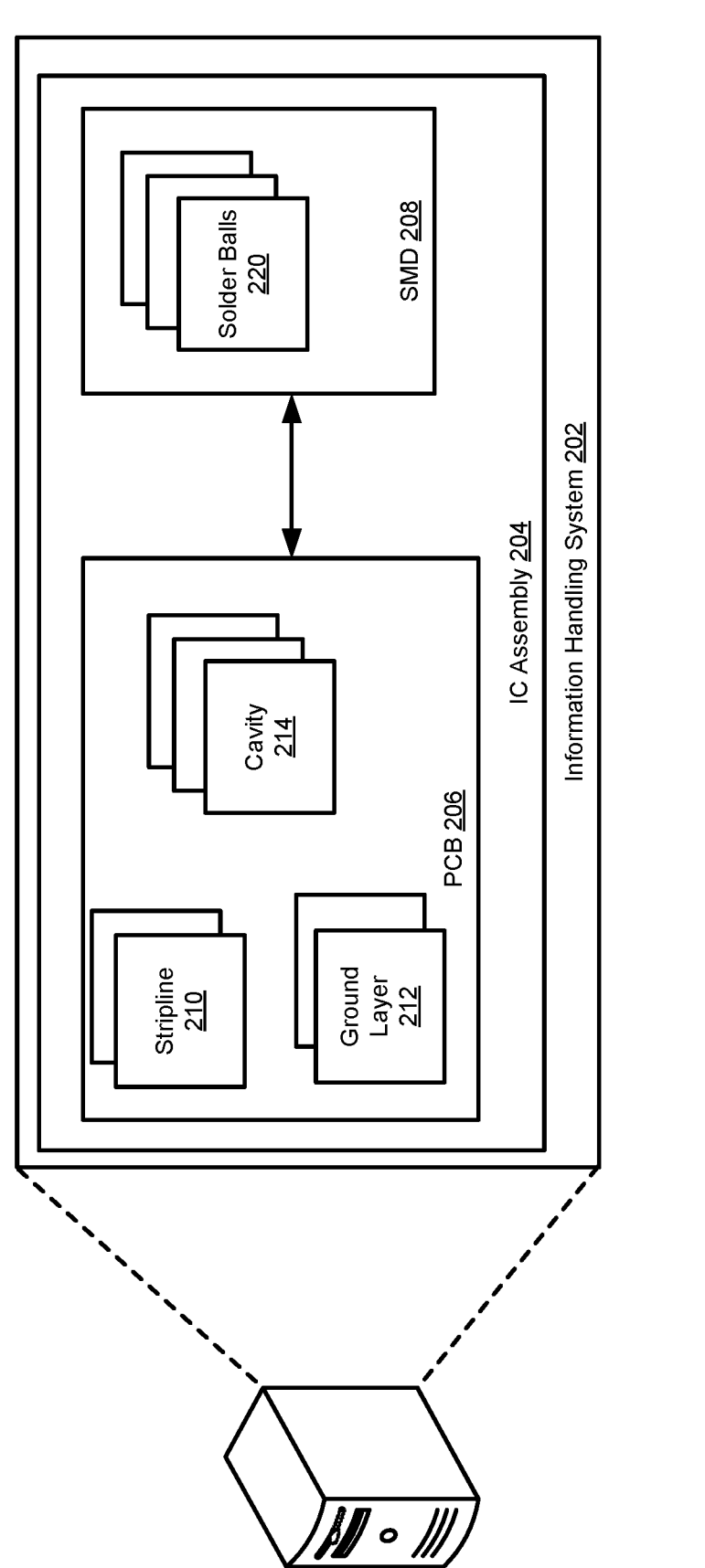
FIG. 2 illustrates a block diagram of an information handling system including a printed circuit board (PCB) and ball grid array (BGA).

Turning to FIG. 2, FIG. 2 illustrates an environment 200 including an information handling system 202. The information handling system 202 can include an integrated circuit (IC) assembly 204. The IC assembly 204 can include a printed circuit board 206 and a surface-mount device (SMD) 208. In some examples, the information handling system 202 is similar to, or includes, the information handling system 100 of FIG. 1.

The PCB 206 can include one or more striplines 210, one or more ground layers 212, and one or more cavities 214. In some examples, the SMD 208 can include a ball grid array (BGA), a dual in-line memory module (DIMM) connector, a series cap, or a quad flat package (QFP). For example, when the SMD 208 includes a BGA, the SMD 208 can include one or more solder balls 220. The SMD 208 can be coupled to (or connected to) the PCB 206, described further herein.

In short, the SMD 208 can directly connect to the PCB 206 by sinking the SMD 208 into the PCB 206 and directly accessing the striplines 210. The SMD 208 can access the striplines 210 without a via, a via stub, or microstrip routing.

Figure 3A:
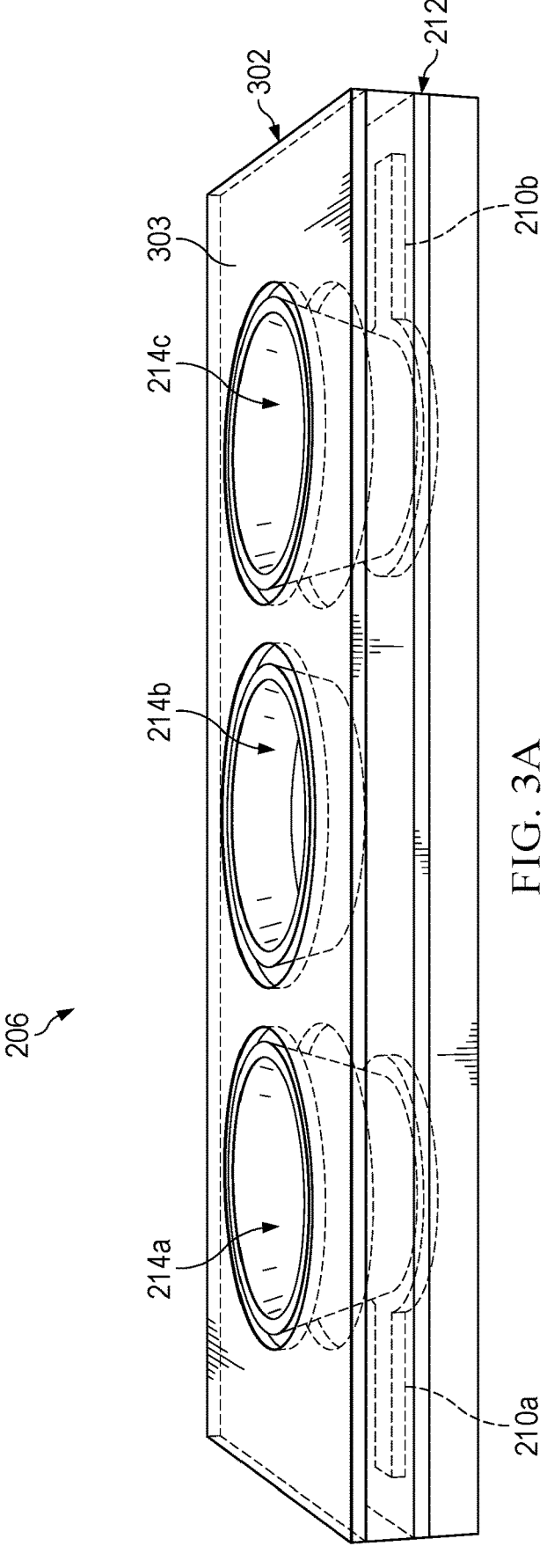
FIG. 3A illustrates a perspective view of a portion the PCB.
Figure 3B:
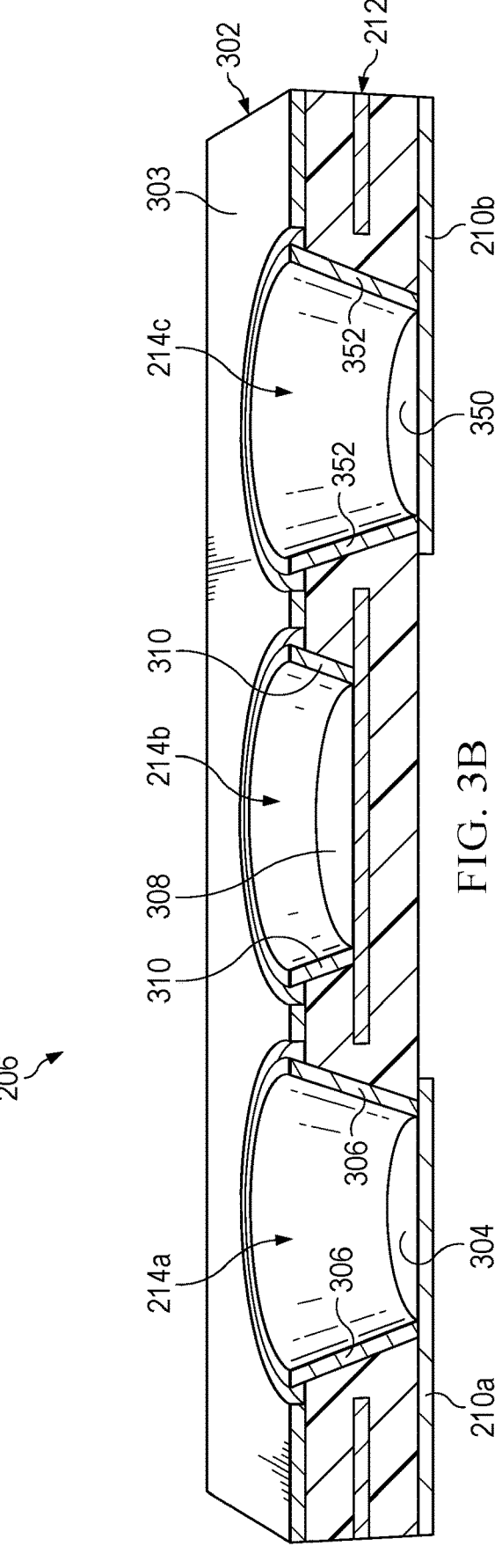
FIG. 3B illustrates a cut-away perspective view of the portion of the PCB.
Figure 3C:
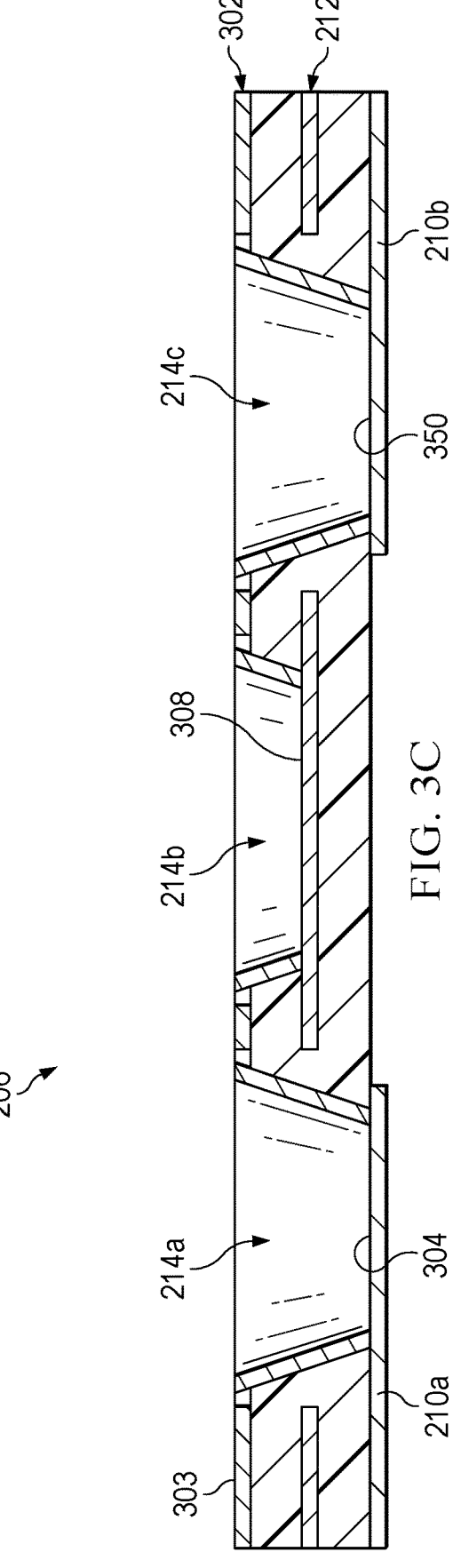
FIG. 3C illustrates a side view of the portion of the PCB.

FIG. 3A illustrates a perspective view of a portion of the PCB 206; FIG. 3B illustrates a perspective view of the portion of the PCB 206; and FIG. 3C illustrates a side view of the portion of the PCB 206. Referring to FIGS. 3A, 3B, 3C, the PCB 206 can include a first stripline 210a and the ground layer 212.

The PCB 206 includes a first cavity 214a. The first cavity 214a extends from a first surface 303 (or top surface 303) of a top layer 302 of the PCB 206 to the first stripline 210a. The first cavity 214a exposes a first portion 304 of the first stripline 210a. In some examples, the first cavity 214a is formed by a laser. That is, the first cavity 214a is formed at the first surface 303 of the PCB 206 (e.g., by the laser).

In some examples, the first cavity 214a can include first plated side walls 306. The first plated side walls 306 can be plated similar to how skip vias are plated. The first stripline 210a and the first plated side walls 306 are not connected to the ground layer 212 (independent of being connected to or coupled with the ground layer 212).

The PCB 206 includes a second cavity 214b. The second cavity 214b extends from the first surface 303 of the PCB 206 to the ground layer 212. The second cavity 214b exposes a second portion 308 of the ground layer 212. In some examples, the second cavity 214b is formed by a laser. That is, the second cavity 214b is formed at the first surface 303 of the PCB 206 (e.g., by the laser). In some examples, the second cavity 214*b* is "shallower" as compared to the first cavity 214*a* (as from the perspective of the first surface 303 of the PCB 206).

In some examples, the second cavity 214*b* can include second plated side walls 310. The second plated side walls 310 can be plated similar to how micro vias are plated.

Figure 4:
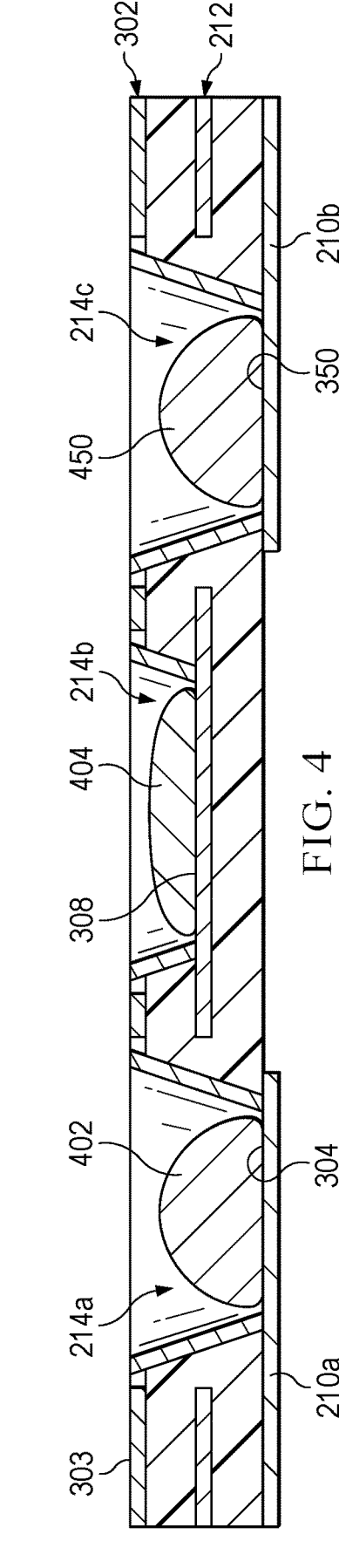
FIG. 4 illustrates a side view of the portion of the PCB including solder paste positioned in respective cavities of the PCB.

FIG. 4 illustrates a side view of the portion of the PCB 206 including solder paste positioned in respective cavities 214 of the PCB 206. Specifically, the first cavity 214*a* includes first solder paste 402. The first solder paste 402 is in contact with the first portion 304 of the first stripline 210*a* that is exposed at the first cavity 214*a*. Furthermore, the second cavity 214*b* includes second solder paste 404. The second solder paste 404 is in contact with the second portion 308 of the ground layer 212 that is exposed at the second cavity 214*b*. In some examples, a quantity of the second solder paste 404 differs from a quantity of the first solder paste 402.

Figure 5:
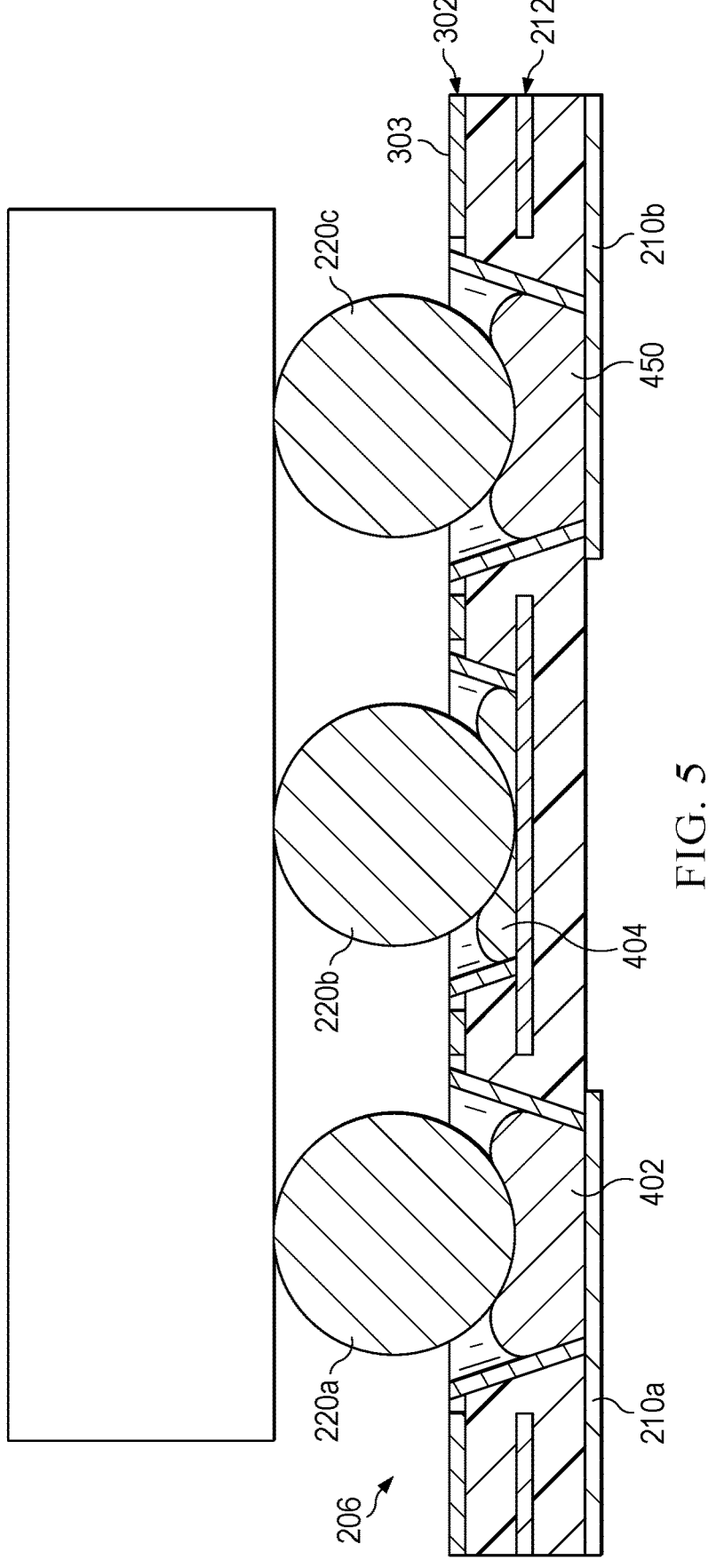
FIG. 5 illustrates a side view of the portion of the PCB in contact with the BGA.

FIG. 5 illustrates a side view of the portion of the PCB 206 in contact with a BGA 590. Referring to FIGS. 4 and 5, specifically, the BGA 590 can include a first solder ball 220*a* and a second solder ball 220*b*. To that end, the BGA 590 can be coupled to the PCB 206; or in other words, the BGA 590 can be connected to the PCB 206; or in other words, the BGA 590 can be in electrical communication with the PCB 206. When the BGA 590 is coupled to the PCB 206, the first solder ball 220*a* is positioned within the first cavity 214*a*. Specifically, the first solder ball 220*a* is positioned within the first cavity 214*a* such that the first solder ball 220*a* contacts the first solder paste 402 in the first cavity 214*a*. In some examples, when first solder ball 220*a* is positioned within the first cavity 214*a*, the first solder ball 220*a* contacts the first solder paste 402 to "spread" the first solder paste 402 about the first cavity 214*a*, including "spreading" the first solder paste 402 to the first plated side walls 306 (shown in FIG. 3B).

To that end, when the first solder ball 220*a* is positioned within the first cavity 214*a*, the first solder paste 402 is coupled between the first solder ball 220*a* and the first portion 304 of the first stripline 210*a* exposed at the first cavity 214*a*. That is, the first solder ball 402 is in contact with the first solder paste 220*a*, and the first solder paste 220*a* is in contact with the first plated side walls 306 and/or in contact with the first portion 304 of the first stripline 210*a*. In other words, the first solder ball 220*a* is in contact with the first stripline 210*a* through the first plated side walls 306 and the first solder paste 402. The first solder ball 220*a* is in electrical communication with the first stripline 210*a* exposed at the first cavity 214*a* via the first solder paste 402 and/or the first plated side walls 306.

Furthermore, when the BGA 590 is coupled to the PCB 206, the second solder ball 220*b* is positioned within the second cavity 214*b*. Specifically, the second solder ball 220*b* is positioned within the second cavity 214*b* such that the second solder ball 220*b* contacts the second solder paste 404 in the second cavity 214*b*. In some examples, when the second solder ball 220*b* is positioned within the second cavity 214*b*, the second solder ball 220*b* contacts the second solder paste 404 to "spread" the second solder paste 404 about the second cavity 214*b*, including "spreading" the second solder paste 404 to the second plated side walls 310 (shown in FIG. 3B).

To that end, when the second solder ball 220*b* is positioned within the second cavity 214*b*, the second solder paste 404 is coupled between the second solder ball 220*b* and the second portion 308 of the ground layer 212 exposed at the second cavity 214*b*. That is, the second solder ball 404 is in contact with the second solder paste 220*b*, and the second solder paste 220*b* is in contact with the second plated side walls 310 and/or in contact with the second portion 308 of the ground layer 212. In other words, the second solder ball 220*b* is in contact with the ground layer 212 through the second plated side walls 310 and the second solder paste 404. The second solder ball 220*b* is in electrical communication with the ground layer 212 exposed at the second cavity 214*b* via the second solder paste 404 and/or the second plated side walls 308.

In some further implementations, referring to FIGS. 3A-3C, the PCB 206 can include a second stripline 210*b*. In some examples, the second stripline 210*b* is the same as the first stripline 210*a* (the first stripline 210*a* and the second stripline 210*b* are one continuous stripline). In some examples, the second stripline 210*b* is different from the first stripline 210*a* (the first stripline 210*a* and the second stripline 210*b* are discontinuous).

The PCB 206 includes a third cavity 214*c*. The third cavity 214*c* extends from the first surface 303 of the PCB 206 to the second stripline 210*b*. The third cavity 214*c* exposes a third portion 350 of the second stripline 210*b*. In some examples, the third cavity 214*c* is formed by a laser. That is, the third cavity 214*c* is formed at the first surface 303 of the PCB 206 (e.g., by the laser).

In some examples, the third cavity 214*c* can include third plated side walls 352. The third plated side walls 352 can be plated similar to how skip vias are plated. The second stripline 210*b* and the third plated side walls 352 are not connected to the ground layer 212 (independent of being connected to or coupled with the ground layer 212).

Referring to FIGS. 4 and 5, the third cavity 214*c* includes third solder paste 450. The third solder paste 450 is in contact with the third portion 350 of the second stripline 210*b* that is exposed at the third cavity 214*c*. In some examples, a quantity of the third solder paste 450 differs from a quantity of the first solder paste 402. In some examples, a quantity of the third solder paste 450 is the same as a quantity of the first solder paste 402.

The BGA 590 can include a third solder ball 220*c*. When the BGA 590 is coupled to the PCB 206, the third solder ball 220*c* is positioned within the third cavity 214*c*. Specifically, the third solder ball 220*c* is positioned within the third cavity 214*c* such that the third solder ball 220*c* contacts the third solder paste 450 in the third cavity 214*c*. In some examples, when third solder ball 220*c* is positioned within the third cavity 214*c*, the third solder ball 220*c* contacts the third solder paste 450 to "spread" the third solder paste 450 about the third cavity 214*c*, including "spreading" the third solder paste 402 to the third plated side walls 350 (shown in FIG. 3B).

To that end, when the third solder ball 220*c* is positioned within the third cavity 214*c*, the third solder paste 450 is coupled between the third solder ball 220*c* and the third portion 350 of the second stripline 210*b* exposed at the third cavity 214*c*. That is, the third solder ball 220*c* is in contact with the third solder paste 450, and the third solder paste 450 is in contact with the third plated side walls 350 and/or in contact with the third portion 350 of the second stripline 210*b*. In other words, the third solder ball 220*c* is in contact with the second stripline 210*b* through the third plated side walls 350 and the third solder paste 450. The third solder ball 220*c* is in electrical communication with the second stripline 210*b* exposed at the third cavity 214*c* via the third solder paste 450 and/or the third plated side walls 350.

Figure 6:
FIG. 6 illustrates a method for forming an integrated circuit assembly including the PCB and the BGA.
Figure 6:
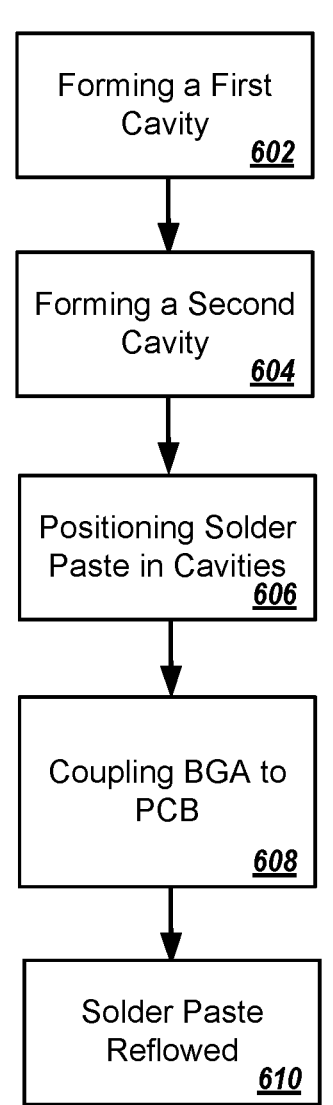

FIG. 6 illustrates a flowchart depicting selected elements of an embodiment of a method 600 for forming the IC assembly 204. The method 600 may be performed with reference to FIGS. 1-5. It is noted that certain operations described in method 600 may be optional or may be rearranged in different embodiments.

The first cavity 214*a* is formed in the PCB 206, at 602. The first cavity 214*a* is formed in the PCB 206 such that the first cavity 214*a* extends from the first surface 303 of the PCB 206 to the first stripline 210*a* of the PCB 206 to expose the first portion 304 of the first stripline 210*a* at the first cavity 214*a*. In some examples, a laser forms the first cavity 214*a*.

The second cavity 214*b* is formed in the PCB 206, at 604. The second cavity 214*b* is formed in the PCB 206 such that the second cavity 214*b* extends from the first surface 303 of the PCB 206 to the ground layer 212 of the PCB 206 to expose the second portion 308 of the ground layer 212 at the second cavity 214*b*. In some examples, a laser forms the second cavity 214*b*.

The first solder paste 402 is positioned within the first cavity 214*a*, at 606. The first solder paste 402 is positioned within the first cavity 214*a* to be in contact with the first portion 304 of the first stripline 210*a* exposed at the first cavity 214*a*.

Furthermore, the second solder paste 404 is positioned within the second cavity 214*b*, at 606. The second solder paste 404 is positioned within the second cavity 214*b* to be in contact with the second portion 308 of the ground layer 212 exposed at the second cavity 214*b*.

The BGA 590 is coupled to the PCB 206, at 608. That is, the first solder ball 220*a* is positioned within the first cavity 214*a*, at 608. The first solder ball 220*a* is positioned within the first cavity 214*a* such that the first solder ball 220*a* contacts the first solder paste 402 in the first cavity 214*a*.

Additionally, the second solder ball 220*b* is positioned within the second cavity 214*b*, at 608. The second solder ball 220*b* is positioned within the second cavity 214*b* such that the second solder ball 220*b* contacts the second solder paste 404 in the second cavity 214*b*.

The first solder paste 402 and the second solder paste 404 are reflowed, at 610. Specifically, the BGA 590 coupled to the PCB 206 are passed through a solder oven to melt the first solder paste 402 and the second solder paste 404 to affix the BGA 590 to the PCB 206.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

What is claimed is:

1. An integrated circuit (IC) assembly, including:
   a printed circuit board (PCB), including:
   a first stripline;
   a ground layer;
   a first cavity extending from a first surface of the PCB to the first stripline, the first cavity exposing a first portion of the first stripline; and
   a second cavity extending from the first surface of the PCB to the ground layer, the second cavity exposing a second portion of the ground layer;
   wherein the first cavity includes first solder paste in contact with the first portion of the first stripline exposed at the first cavity,
   wherein the second cavity includes second solder paste in contact with the second portion of the ground layer exposed at the second cavity,
   a ball grid array (BGA), including a first solder ball and a second solder ball;
   wherein the BGA is coupled to the PCB, including:
   the first solder ball positioned within the first cavity such that the first solder ball contacts the first solder paste in the first cavity; and
   the second solder ball positioned with the second cavity such that the second solder ball contacts the second solder paste in the second cavity.

2. The assembly of claim 1, the first cavity including first plated side walls.

3. The assembly of claim 2, wherein the first solder paste is coupled between the first solder ball and the first portion of the first stripline exposed at the first cavity.

4. The assembly of claim 3, wherein the first solder ball is in electrical communication with the first portion of the first stripline exposed at the first cavity via the first solder paste.

5. The assembly of claim 1, wherein the first cavity is formed at the first surface of the PCB, wherein the second cavity is formed at the first surface of the PCB.

6. The assembly of claim 1, the second cavity including second plated side walls.

7. The assembly of claim 6, wherein the second solder paste is coupled between the second solder ball and the second portion of the ground layer exposed at the second cavity.

8. The assembly of claim 7, wherein the second solder ball is in electrical communication with the second portion of the ground layer exposed at the second cavity via the second solder paste.

9. The assembly of claim 1,
   wherein the PCB further includes:
   a second stripline; and a third cavity extending from the first surface of the PCB to the second stripline, the third cavity exposing the second stripline, the third cavity including a third solder paste in contact with the third portion of the second stripline exposed at the third cavity, wherein the BGA includes a third solder ball, wherein the BGA is coupled to the PCB, including:

the third solder ball positioned within the third cavity such that the third solder ball contacts the third solder paste in the third cavity.

10. The assembly of claim 9, wherein the first stripline is the same as the second stripline.

11. The assembly of claim 9, wherein the first stripline is different from the second stripline.

\* \* \* \* \*